United States Patent [19]
Guillaud et al.

[11] Patent Number: 5,594,760
[45] Date of Patent: Jan. 14, 1997

[54] AUTOMATIC GAIN CONTROL CIRCUIT AND APPARATUS INCLUDING SUCH A CIRCUIT

[75] Inventors: Jean-Michel Guillaud, Montgeron; Georges Martinez, Caen, both of France

[73] Assignee: U.S. Philips Corporation, New York, N.Y.

[21] Appl. No.: 525,990

[22] Filed: Sep. 8, 1995

[30] Foreign Application Priority Data

Sep. 13, 1994 [FR] France .................................. 94 10906

[51] Int. Cl.⁶ .................................................. H04L 27/08
[52] U.S. Cl. ...................... 375/345; 330/254; 455/245.1
[58] Field of Search ................................. 375/323, 345; 455/234.1, 237.1, 245.1; 330/254, 278

[56] References Cited

U.S. PATENT DOCUMENTS 4,691,377  9/1987  Yoshihara et al. ................ 455/256
4,870,370  9/1989  Hedberg et al. ................... 330/133

FOREIGN PATENT DOCUMENTS 0176303  4/1986  European Pat. Off. .
0431435  6/1991  European Pat. Off. .

*Primary Examiner*—Stephen Chin
*Assistant Examiner*—Sean L. Ingram
*Attorney, Agent, or Firm*—Eugene J. Rosenthal

[57] ABSTRACT

Automatic gain control circuit comprising amplifier means (10) which produce an output signal that has an amplitude controlled by a control signal (CT). Recursive filter apparatus (20) (22) measures the power of the output signal and yield a measure of power which is compared (24) with a window of permitted power values to generate the control signal (CT). Depending on the result of the comparison, an initialization signal (INI) is transmitted which enforces a reference power value on a recursive filter to accelerate the gain control. Utilization in apparatus that use signals that have fast and considerable amplitude variations, as in digital modulation signal receivers.

8 Claims, 2 Drawing Sheets 5,594,760

AUTOMATIC GAIN CONTROL CIRCUIT AND APPARATUS INCLUDING SUCH A CIRCUIT

FIELD OF THE INVENTION

The invention relates to an automatic gain control circuit comprising first means for applying a gain to an input signal and for deriving therefrom an output signal, second means for measuring the power of the output signal, third means for comparing the measured signal power with a window of permitted reference power values and for deriving therefrom a control signal for checking the gain applied by the first means.

It also relates to an apparatus that needs to include an automatic gain control, for example, a signal receiver intended to receive input signals whose amplitude varies fast over a large dynamic range. Amongst other things, the invention relates to a signal receiver for receiving digitally modulated signals, for example, phase shift keyed (PSK) signals or quadrature amplitude modulated (QAM) signals. Such a receiver can be used in digital television, in telephony or in other digital or analog transmission systems.

BACKGROUND OF THE INVENTION

When there are large amplitude variations in an input signal, difficulties may show up when the amplitude of the input signal is to be tuned to the dynamic range of the input element of the receiver. This becomes a crucial problem, for example, in the case where the input element is an analog-to-digital converter. Situations may occur in which the input signal saturates the converter and other situations in which the amplitude of the input signal is too low, which leads to poorly obtained digitized signal. It is thus necessary to check the gain of the input signal by means of an automatic gain control circuit.

For slaving the amplitude of the input signal to the dynamic range of the input element, one currently uses an automatic gain control circuit. To cope with both high and low gains, there are circuits comprising a stage that checks the high gains and a stage that checks the low gains. The document U.S. Pat. No. 4,870,370 relates to such a situation in which the activation of the stages depends on the amplitude of the input signal. Therefore, the power of the received signal is measured after which this power is compared with a window of permitted power values to utilize one or the other stage depending on whether the measured power lies inside or outside the window.

When there are considerable and fast amplitude variations, which is generally the case with signals subjected to a digital modulation, one seeks to avoid that the automatic gain control circuit causes too much time to elapse before an appropriate control is obtained. In effect, during this period of time an incorrect input signal is often obtained.

SUMMARY OF THE INVENTION

It is thus an object of the invention to reduce in the best possible way this period of time in which an incorrect signal is obtained.

This object is achieved by an automatic gain control circuit for which the means for measuring the signal power comprise low-pass recursive filter means, while the means for comparing the measured power with a window of permitted reference power values produces an initialization signal which enforces a reference power value on the filter means when the said value lies outside the window of permitted reference power values.

Thus, advantageously, when the measured power differs from the selected reference window, the initialization signal causes the circuit to reinitialize with this reference power value, which makes it possible for the circuit to reach an appropriate control rapidly. This reference power has previously been determined as a function of the particular type of application.

Preferably, the low-pass recursive filter means comprise in a cascaded combination a first low-pass filter which has a passband with an abrupt transition characterized by a first cut-off frequency and a second low-pass smoothing filter which has a passband characterized by a second cut-off frequency which is lower than the first cut-off frequency. The cut-off frequencies are selected as a function of the type of the particular digital modulation.

Thus, advantageously, the first filter eliminates to a high degree the high-frequency components of the input signal which yields a first power signal. This power signal in its turn is filtered according to a more progressive filter pattern to form the actual power signal. This cascaded combination of two filters makes it possible to reduce the complexity of the hardware means necessary for extracting the power information.

These and other aspects of the invention will be apparent from and elucidated with reference to the embodiments described hereinafter.

DESCRIPTION OF THE EMBODIMENTS

Figure 1:
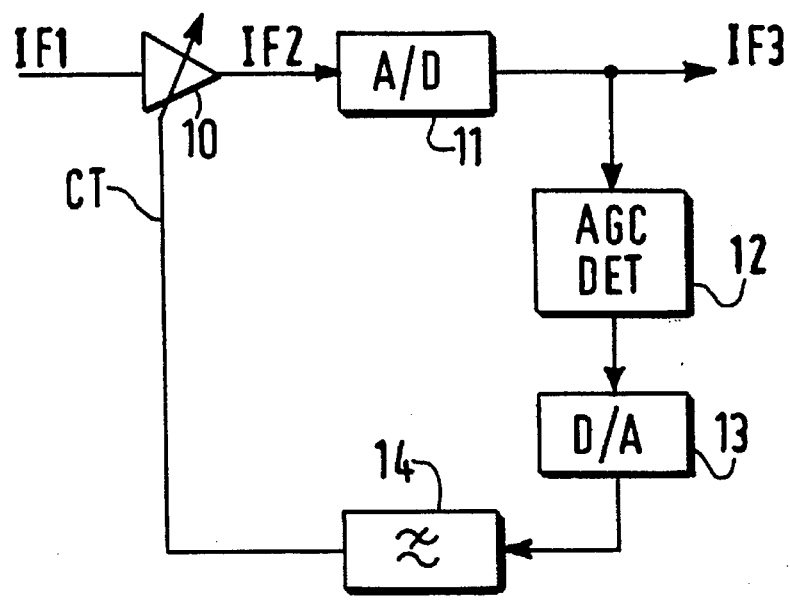
FIG. 1 shows a diagram of an automatic gain control circuit.

FIG. 1 represents an automatic gain control circuit comprising amplifier means 10 for amplifying an input signal IF1, for example, a digitally modulated intermediate frequency signal. The term gain is used to denote both a gain smaller than, larger than or equal to unity.

By way of example, let us consider the case where the receiver performs digital processing by amplifier means 10 connected to analog-to-digital converter means 11 at whose input one wishes to check the amplitude of the input signal IF2.

To let the input signal IF2 not saturate the converter 11, or be too weak, which would result in an analog-to-digital conversion which is too unprecise, it is desirable to keep the input signal IF2 well tuned to the dynamic range of the input of the converter. Therefore, an automatic gain control loop measures the output signal IF3 on the output of the converter 11. This loop comprises means 12 for measuring the power of the signal IF3 and for producing a control signal CT which influences the amplifier means 10. The means 12 form a detector AGC DET for the automatic gain control loop.

When the measuring means 12 operate in digital form, as in the example, a digital-to-analog conversion is then effected in a converter 13 whose output signal is filtered by low-pass filter means 14 to produce the analog control signal CT.

Figure 2:
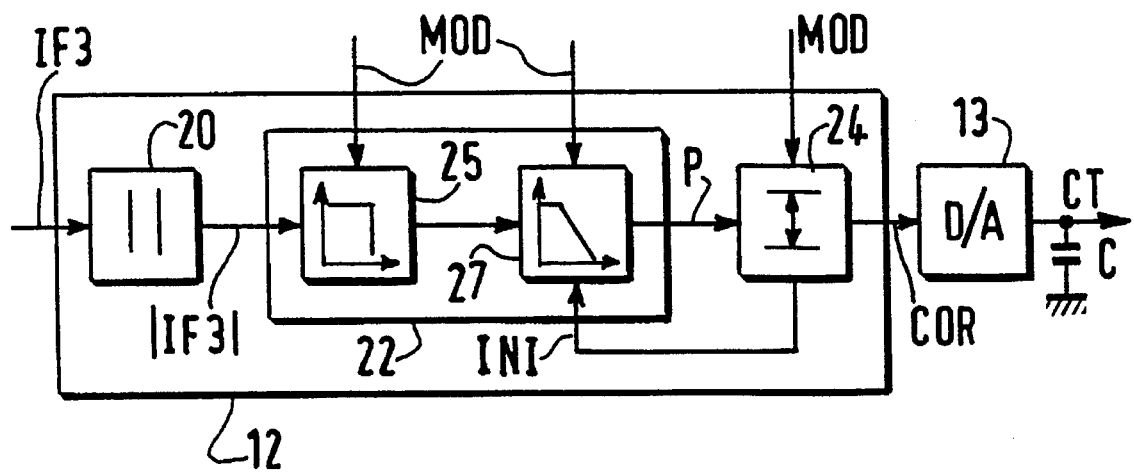
FIG. 2 shows a diagram of an automatic gain control circuit according to the invention.

The means 12 for measuring the power of the signal IF3 are shown in FIG. 2. They comprise, in a series combination, means 20 for employing the absolute value of the signal IF3, recursive low-pass filter means 22 which produce a mean power P of the signal IF3, and means 24 for comparing the mean measured power P with a window of permitted reference power values lying between a maximum value Pmax and a minimum value Pmin. Note that as used herein, as is well known in the art, the measured power P may be determined by measuring a signal from which P can be computed in a known, prescribed manner. Alternatively, the window values may be expressed in terms of such other measured signals. The filter means 14 may be formed by a simple capacitor C.

The comparing means 24 produce a correction signal COR which may preferably assume three values:

COR=0 when Pmin≦Pm≦Pmax

COR=1 when Pm>Pmax

COR=−1 when Pm<Pmin.

For COR=0, the signal IF2 is correctly adapted to the dynamic range of the input of the converter 11 and the gain of the amplifier means 10 does not undergo any change.

For COR=−1 or COR=1, the signal IF2 is incorrectly adapted to the dynamic range of the input of the converter 11. One imagines that the reaction time of the loop must not be too long to avoid very large delays, but at the same time must not be too short either at the peril of causing poorly adapted and unwanted changes of gain. This risk becomes particularly manifest in input signals IF1 which have undergone coded modulation and have abrupt and considerable amplitude variations. For adapting to the dynamic range of the converter input in the fastest way possible and to avoid said risks, according to the invention the comparing means 24 further produce an initialization signal INI which is used for enforcing a reference power value Pd on the recursive filter means 22. The reference power lies between the values Pmin and Pmax, for example, Pd=(Pmin+Pmax)/2. This initialization is made possible by the recursive nature of the filter means 22.

This initialization signal is such that:

INI=0 when Pmin≦Pm≦Pmax

INI=1 when Pm>Pmax or Pm<Pmin.

Thus, when the measured power lies outside the window Pmin-Pmax, the signal INI is used for loading a reference power value Pd in the recursive filter means 22. The reference power is preferably selected as a function of a particular application, for example, of the type of modulation. A control signal MOD may permit of selecting the size of the window, the reference power Pd as well as the cut-off frequencies $f_1$ and $f_2$ in the case where the transmission system is provided for functioning with various digital modulations.

Figure 3:
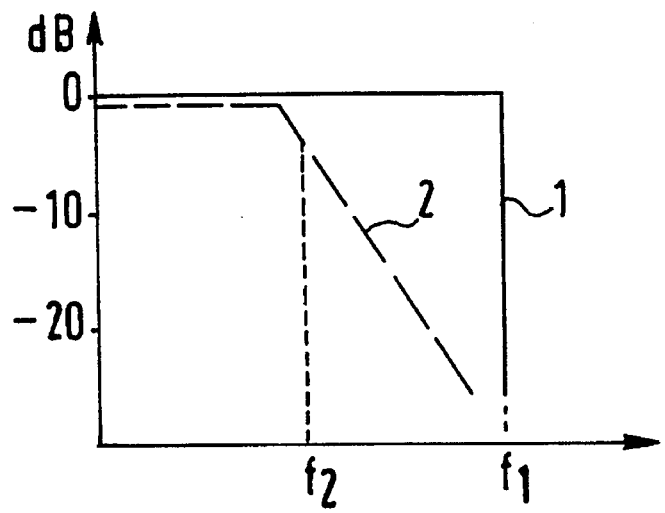
FIG. 3 shows two curves illustrating examples of filter patterns of the two low-pass filters.

Preferably, the filter means 22 comprise the connecting in a cascaded combination of a first low-pass filter 25 which has a passband with an abrupt transition, followed by a second low-pass filter 27 which has a passband with a smooth transition. The passbands of the two filters are those, for example, shown in FIG. 3. The abrupt transition of the first filter (curve 1) is characterized by a cut-off frequency $f_1$ (3 dB). The smooth transition of the second filter (curve 2) is characterized by a cut-off frequency $f_2$ (3 dB) lower than the cut-off frequency $f_1$. Thus, the first filter 25 strictly filters the high-frequency components out of the input signal, the obtained signal in its turn being smoothed by the second filter 27 to obtain a usable measure of power. This cascaded connection of two filters makes it possible for the first filter to measure a mean power whose variations are, they too, eliminated by the second filter. The structures of the two filters may thus be very simple.

Figure 4:
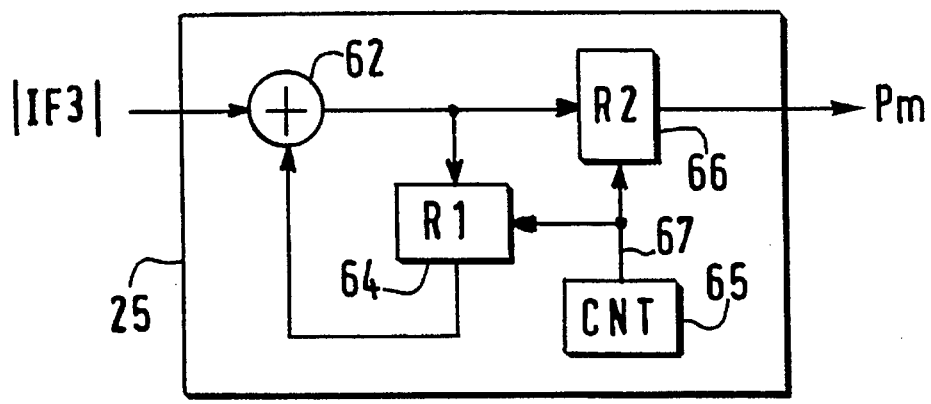
FIG. 4 shows a diagram of a first recursive low-pass filter and FIG. 5 shows a diagram of the second recursive low-pass filter which can be initialized.

FIG. 4 shows a diagram of the first filter 25. It comprises an adder 62 which receives on a first input the absolute value |IF3| of the signal IF3 and on the other input the output signal of the delay means 64, for example, registers R1, which are connected to the output of the adder 62. To obtain a measure of mean power along a horizon of N samples, for example N=64, an output cell 66, for example, registers R2, produces one measure every 64 samples. For example, with an input signal IF1 modulated via a symbol frequency modulation 1/T, the first and second filters 25, 27 operate at a rate 4/T, that is, four times the symbol rate. A counter 65 CNT produces a counting signal 67 for each block of 64 clock periods 4/T, the counting signal extracting the mean power value Pm of the output cell 66 and resetting the delay means 64 to zero to permit the filter 25 of producing the next measure of mean power.

Figure 5:
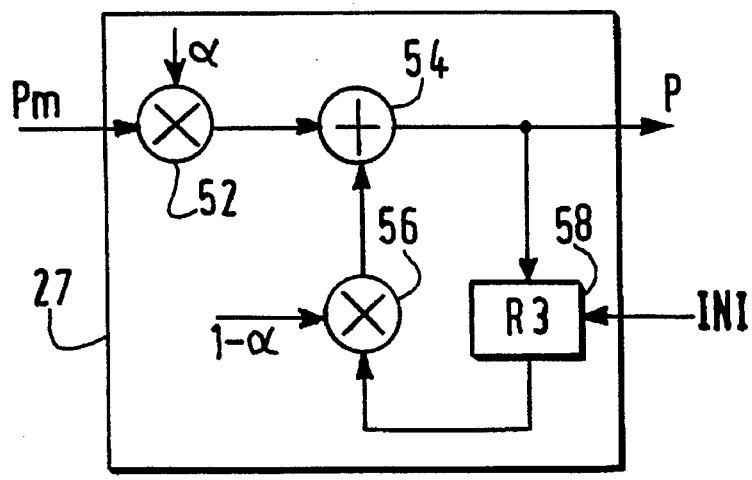

FIG. 5 represents a diagram of the second filter 27. It comprises a first multiplier 52 which receives the mean power signal Pm to be filtered and a coefficient α. The output of the first multiplier 52 is connected to an input of an adder 54 which receives on another input the output signal of a second multiplier 56. The latter is placed in a loop which also includes delay means 58, for example, registers R3. The output of the adder 54 produces the filtered mean power signal P which is to be compared with the window of permitted values. To form the recursive loop, the signal P enters the delay means 58 whose output is connected to an input of the multiplier 56 which itself has a further input that receives a coefficient 1−α. For initialization with the reference power Pd, the delay means 58 are loaded with the reference power value via the initialization signal INI. For example, the registers forming the delay means 58 may be loaded with a binary word. The multipliers and the adder may be of an integrated structure.

The automatic gain control circuit (analog) makes it possible to control amplitudes of signals IF2 and IF3 (digital). It is possible to control the amplitude of the signal IF2 not by effecting an analog-to-digital conversion 11, nor a digital-to-analog conversion 13 and by performing the other functions in the analog mode.

The foregoing merely illustrates the principles of the invention. It will thus be appreciated that those skilled in the art will be able to devise various arrangements which, although not explicitly described or shown herein, embody the principles of the invention and are thus within its spirit and scope.

We claim:

1. Automatic gain control circuit, comprising: first means for applying a gain to an input signal and for deriving therefrom an output signal, second means for measuring the power of the output signal, third means for comparing the measured signal power with a window of permitted reference power values and for deriving therefrom a control signal for checking the gain applied by the first means, characterized in that the second means comprise low-pass recursive filter means, while the third means furthermore produces an initialization signal which enforces a reference power value on the filter means when the said value lies outside the window of permitted reference power values.

2. Circuit as claimed in claim 1, characterized in that the recursive filter means comprise in a cascaded combination a first low-pass filter which has a passband with an abrupt transition characterized by a first cut-off frequency, and a second low-pass smoothing filter which has a passband characterized by a second cut-off frequency which is lower than the first cut-off frequency.

3. Circuit as claimed in claim 2, characterized in that the input signal comes from a digital modulation.

4. Signal receiver, characterized in that it comprises an automatic gain control circuit as claimed in claim 2.

5. Signal receiver, characterized in that it comprises an automatic gain control circuit as claimed in claim 3.

6. Circuit as claimed in claim 1, characterized in that the input signal comes from a digital modulation.

7. Signal receiver, characterized in that it comprises an automatic gain control circuit as claimed in claim 6.

8. Signal receiver, characterized in that it comprises an automatic gain control circuit as claimed in claim 1.

* * * * *